United States Patent [19]

Vermeersch et al.

[11] Patent Number: 5,403,694

[45] Date of Patent: Apr. 4, 1995

[54] WATER DEVELOPABLE DIAZO BASED LITHOGRAPHIC PRINTING PLATE COMPRISING AN INTERMEDIATE LAYER HAVING A POLYSACCHARIDE

[75] Inventors: Joan Vermeersch, Deinze; Dirk Kokkelenberg, St. Niklaas; Guido Hauquier, Nijlen, all of Belgium

[73] Assignee: AGFA-Gevaert, N.V., Mortsel, Belgium

[21] Appl. No.: 164,957

[22] Filed: Dec. 10, 1993

[30] Foreign Application Priority Data

Dec. 11, 1992 [EP] European Pat. Off. ............ 92203835

[51] Int. Cl.$^6$ .................. G03C 1/54; G03C 1/77; G03F 7/021
[52] U.S. Cl. .................... 430/159; 430/160; 430/161; 430/175; 430/176; 430/272; 430/278; 430/302
[58] Field of Search ............... 430/159, 160, 302, 272, 430/278, 162, 161, 175, 176

[56] References Cited

U.S. PATENT DOCUMENTS

| | | | |
|---|---|---|---|
| 3,971,660 | 7/1976 | Staehle | 430/302 |
| 4,284,705 | 9/1981 | Phlipot et al. | 430/159 |
| 4,483,913 | 11/1984 | Eklund et al. | 430/161 |

*Primary Examiner*—Charles L. Bowers, Jr.
*Assistant Examiner*—John S. Chu
*Attorney, Agent, or Firm*—Breiner & Breiner

[57] ABSTRACT

The present invention provides an imaging element comprising on a support in the order given, a hydrophilic layer containing a hydrophilic (co)polymer or (co)polymer mixture and being hardened with a hydrolyzed tetraalkyl orthosilicate crosslinking agent and a light sensitive layer containing a diazo resin or a diazonium salt characterized in that an intermediate hydrophilic layer containing an organic compound having one or more cationic groups is provided between said hydrophilic layer and said light-sensitive layer. There is further provided a method for making such an imaging element and a method for making a lithographic printing plate therewith.

3 Claims, No Drawings

WATER DEVELOPABLE DIAZO BASED LITHOGRAPHIC PRINTING PLATE COMPRISING AN INTERMEDIATE LAYER HAVING A POLYSACCHARIDE

FIELD OF THE INVENTION

The present invention relates to a diazo sensitized lithographic printing plate which is developable by plain water.

BACKGROUND OF THE INVENTION

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers.

Particularly diazo-sensitized systems are widely used. These systems have been extensively reviewed by Kosar J. in "Light-Sensitive Systems", Wiley, New York, 1965, Chapter 7. A generally used negative-working diazo-sensitized system is based on the capability of diazo compounds to harden a polymer when exposed to ultraviolet and blue radiation. Diazo compounds which have been used for the preparation of lithographic printing plates based on their hardening properties are e.g. diazonium salts whose photolysis products can harden polymers (natural colloids or synthetic resins) directly and diazonium polymers. Although polymers containing diazonium groups have a large structure they remain water soluble owing to the presence of the ionic diazonium groups. When these groups are destroyed by exposure to light an insoluble resin is formed. Particularly useful diazonium polymers are the condensation products of a carbonyl compound, e.g. an aldehyde, such as formaldehyde, with a diazonium salt of e.g. a p-aminodiphenylamine. These condensation products are usually designated diazo resins. In these systems a polymeric binder is optionally added to the diazo resin coating.

Several types of supports can be used for the manufacturing of a diazo-sensitized lithographic printing plate. Common supports are metal supports like Al or Zn, polyester film supports and paper bases. These supports, if not sufficient hydrophilic by themselves, are first coated with a hydrophilic layer to form the hydrophilic background of the printing plate and a top layer containing the diazo compound is then applied (see for example DE-P-1900469, DE-P-2030634 and U.S. Pat. No. 3,971,660).

It is known to use as hydrophilic layer in these systems a layer containing polyvinyl alcohol and hydrolyzed tetraethyl orthosilicate and preferably also silicium dioxide and/or titanium dioxide as described in e.g. GB-P-1419512, FR-P-2300354, U.S. Pat. Nos. 3,971,660 and 4,284,705. This hydrophilic layer is overcoated with a light-sensitive layer containing a diazonium salt or a diazo resin in a polymeric binder.

Upon image-wise exposure of the light-sensitive layer the exposed image areas become water insoluble and the unexposed areas remain water soluble. The plate is then developed with water to remove the diazonium salt or diazo resin in the unexposed areas.

However it has been found that the dissolving power of water is insufficient to remove all the diazo in the non-exposed areas. As a consequence there will remain some diazo compound in the non-printing areas which can result in unwanted ink acceptance in the non-printing areas (scumming). According to EP-A-450199 this problem can be solved by adding an anti-scumming agent e.g. a phosphate to the hydrophilic layer. However the anti-scumming agent may interfere with the hardening of the hydrophilic layer and the printing plate obtained from such an imaging element requires a dedicated fountain solution, also called dampening liquid during printing to prevent scumming during printing.

SUMMARY OF THE INVENTION

It is an object of the present invention to provide a diazo based imaging element for producing a lithographic printing plate that can be processed with plain water to remove the diazo compound in the non-exposed areas.

It is also an object of the present invention to provide a method for making a diazo based imaging element as defined above.

It is a further object of the present invention to provide a method for obtaining a lithographic printing plate using a diazo based imaging element as defined above.

Other objects will become apparent from the description hereinafter.

According to the present invention an imaging element comprising on a support in the order given, a hydrophilic layer containing a hydrophilic (co)polymer or (co)polymer mixture and being hardened with a hydrolyzed tetraalkyl orthosilicate crosslinking agent and a light sensitive layer containing a diazo resin or a diazonium salt characterized in that an intermediate hydrophilic layer containing an organic compound having one or more cationic groups is provided between said hydrophilic layer and said light-sensitive layer.

According to the present invention there is provided a method for making a diazo based imaging element comprising the steps of:

providing on a support a hydrophilic layer containing a hydrophilic (co)polymer or (co)polymer mixture and a hydrolyzed tetraalkyl orthosilicate, hardening said hydrophilic layer, providing thereon an intermediate hydrophilic layer containing an organic compound having one or more cationic groups and a light sensitive layer containing a diazo resin or a diazonium salt.

According to the present invention there is provided a method for obtaining a lithographic printing plate comprising the steps of image-wise exposing an imaging element as defined above and subsequently removing the light sensitive layer in the non-exposed or insufficiently exposed areas of said imaging element by means of rinsing or washing said imaging element with plain water.

DETAILED DESCRIPTION

It has been found that by providing an intermediate layer of an organic compound having cationic groups between the hydrophilic and light sensitive layer a diazo based imaging element is obtained that can be developed using plain water instead of special developing liquids. The thus obtained printing plate can be used to print with a commonly used fountain solution and has excellent printing properties, i.e. no scumming, good printing endurance, etc.

The organic compounds having cationic groups for use in connection with the present invention are preferably hydrophilic and may be low molecular weight compounds but are preferably polymers. Preferred compounds are those having one or more ammonium groups or amino groups that can be converted to ammonium groups in an acidic medium. An especially preferred type of cationic compounds are polysaccharides modified with one or more groups containing an ammonium or amino group.

Most preferred organic compounds having cationic groups are dextrans or pullulan wherein at least some of the hydroxy groups have been modified into one or more of the following groups:

$$-O-R^1$$

$$-O-CO-R^2$$

wherein $R^1$ represents an organic residue containing an amino or ammonium group, e.g. an amine substituted alkyl, an amine substituted alkylaryl etc.

$R^2$ has one of the significances given for $R^1$ or stands for $-OR^3$ or $-N(R^4)R^5$, wherein $R^3$ has one of the significances given for $R^1$ and each of $R^4$ and $R^5$ which may be the same or different and have one of the significances given for $R^1$.

Pullulan is a polysaccharide that is produced by micro-organisms of the *Aureobasidium pullulans* type (*Pullularia pullulans*) and that contains maltotriose repeating units connected by a α-1,6 glycosidic bond. Pullulan is generally produced on industrial scale by fermentation of partially hydrolyzed starch or by bacterial fermentation of sucrose. Pullulan is commmercially available from e.g. Shodex, Pharmacosmos.

Examples of dextrans or pullulan suitable for use in accordance with the present invention are dextrans or pullulan wherein some of the hydroxyl groups have been modified in one of the groups shown in table 1.

The modified dextrans or pullulan can be prepared by a reaction of a dextran with e.g. alkylating agents, chloroformates, acid halides, carboxylic acids etc.

The organic compound having one or more cationic groups according to the invention is preferably provided in an amount of 5 to 500 mg/m² and more preferably in an amount of 10 to 200 mg/m².

As hydrophilic (co)polymers in said hydrophilic layer one may use, for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is the same as or higher than the hydrophilicity of polyvinyl acetate hydrolyzed to at least an extent of 60 percent by weight, preferably 80 percent by weight.

Examples of hydrolyzed tetraalkyl orthosilicate crosslinking agents are hydrolyzed tetraethyl orthosilicate and hydrolyzed tetramethyl orthosilicate.

The amount of tetraalkyl orthosilicate crosslinking agent is at least 0.2 parts by weight per part by weight of hydrophilic (co)polymer, preferably between 0.5 and 5 parts by weight, more preferably between 1.0 parts by weight and 3 parts by weight.

Said hydrophilic layer in the imaging element used in accordance with the present invention preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the layer is given a uniform rough texture consisting of microscopic hills and valleys, which serve as storage places for water in background areas.

The thickness of the hydrophilic layer in the material of this invention may vary in the range of 0.2 to 25 um and is preferably 1 to 10 um.

Examples of low-molecular weight diazonium salt for use in the present invention include: benzidine tetrazoniumchloride, 3,3′-dimethylbenzidine tetrazoniumchloride, 3,3′-dimethoxybenzidine tetrazoniumchloride, 4,4′-diaminodiphenylamine tetrazoniumchloride, 3,3′-diethylbenzidine tetrazoniumsulfate, 4-aminodiphenylamine diazoniumsulfate, 4-aminodiphenylamine diazoni-

TABLE 1

| no. | modified group |
|-----|----------------|
| 1 | $-O-CH_2-CH_2-NH_2$ |
| 2 | $-O-CO-NH-CH_2-CH_2-NH_2$ |
| 3 | $-O-CO-NH-CH_2-CH_2-N(CH_2-CH_2-NH_2)_2$ |
| 4 | $-O-CH_2-CH_2-NH-CH_2-CH_2-NH_2$ |
| 5 | $-O-CH_2-CH_2-NH-CH_2-CHOH-CH_2-N^+(CH_3)_3Cl^-$ |
| 6 | $-O-(CH_2-CH_2-O)_n-CH_2-CH_2-NH_2$ |
|   | wherein n represents an integer from 1 to 50 |
| 7 | $-O-CO-NH-CH_2-CH_2-NH-CH_2-CHOH-CH_2-N^+(CH_3)_3Cl^-$ |
| 8 | $-O-CH_2-CH_2-N(CH_2-CH_3)_2.HCl$ |
| 9 | $-O-CH_2-CH_2-N(CH_2-CH_2-NH_2)_2$ |
| 10 | $-O-CONH-CH_2-CH_2-N(CH_2-CH_2-NH_2)_2$ |
| 11 | $-O-CONH-(CH_2-CH_2-O)_n-CH_2-CH_2-NH_2$ | umchloride, 4-piperidino aniline diazoniumsulfate, 4-diethylamino aniline diazoniumsulfate and oligomeric condensation products of diazodiphenylamine and formaldehyde.

Examples of diazo resins useful in the present invention include condensation products of an aromatic diazonium salt as the light-sensitive substance. Such condensation products are known and are described, for example, in German Pat. no. 1214086. They are in general prepared by condensation of a polynuclear aromatic diazonium compound, preferably of substituted or unsubstituted diphenylamine-4-diazonium salts, with active carbonyl compounds, preferably formaldehyde, in a strongly acid medium.

In addition to the diazo resin or diazonium salt the light sensitive layer according to the present invention preferably contains dispersed water-insoluble polymers. Said aqueous dispersion of water insoluble polymer is preferably cationic or nonionic either e.g. as a result of an emulsifier or by having the cationic or nonionic group linked to the polymer. The water insoluble polymer is preferably a solid particulate having a size in the range of about 100 Angstroms to 1 micron in diameter and does not form a film below 30° C. In general, any polymer which carries a cationic or nonionic group or which can be formulated into an emulsion using a cationic or nonionic emulsifier can be employed in the present invention. Suitable polymers include homopolymers and copolymers of styrene, methylacrylate, ethylacrylate, butylacrylate, methylmethacrylate, ethylmethacrylate, butyl methacrylate, vinyl acetate, vinyl chloride, vinylidene chloride, butadiene, methyl styrene, vinyl toluene, dimethylaminoethyl acrylate, acrylic acid, methacrylic acid, isoprene, chloroprene, malei anhydride, ethylene glycol acrylates such as polyethylene glycol acrylate, halogenated vinyl aromatics such as chlorostyrene and bromostyrene, methylvinyl ether, vinyl pyrrolidone, polyurethane and the like.

Among the cationic and nonionic emulsifiers which can be used in the present invention are: ammonium salts of substituted amines containing alkyl and/or aryl groups attached to the nitrogen, alkyl or aryl sulfonium salts, alkyl and alkyl-aryl polyethers, cationic or nonionic fluorosurfactants and polyoles.

The thickness of the light-sensitive layer in the material of this invention may vary in the range of 0.1 to 10 um and is preferably between 0.5 and 2.5 um.

The imaging element in connection with the present invention advantageously contains water-soluble dyes such as rhodamines, sudan blue, methylen blue, eosin or triphenylmethane dyes such as crystal violet, victoria pure blue, malachite green, methylviolet and fuchsin or dye pigments. These colorants may be incorporated in the light sensitive layer and/or hardened hydrophilic layer.

Various supports may be used for the imaging element in accordance with the present invention provided it has been treated to provide a surface to which the hydrophilic layer can be applied and adheres. Examples of such supports are photographic film bases e.g. substrated polyethylene terephthalate film, cellulose acetate film, plastics having a metal layer or deposit thereon, a metal support, e.g. aluminium and polyolefin (e.g. polyethylene) coated paper, the polyolefin surface of which may have been subjected to a corona discharge to improve the adherence of the hydrophilic layer.

According to the method of the present invention the above described imaging element can be produced by providing on a support a hydrophilic layer containing a hydrophilic (co)polymer or (co)polymer mixture and a hydrolyzed tetraalkyl orthosilicate. Said hydrophilic layer is subsequently hardened by subjecting it to a temperature between 20° C. and 200° C.

The thus obtained hardened hydrophilic layer is then provided with an intermediate hydrophilic layer containing an organic compound having one or more cationic groups and a light sensitive layer as described above.

The layers on the support of the imaging element in connection with the present invention may be provided by any suitable coating technique, e.g. air knife, slide hopper or curtain coating, or they may be laminated from a temporary support.

To obtain a lithographic printing plane from an imaging element according to the invention said imaging element is image-wise exposed and subsequently rinsed or washed with plain water to remove diazo resin or diazonium salts in the non-exposed or insufficiently exposed parts of the imaging element.

The exposure of the imaging element used in the present invention advantageously proceeds with ultraviolet light optionally in combination with blue light in the wavelength range of 250 to 500 nm. Useful exposure sources are high or medium pressure halogen mercury vapour lamps, e.g. of 1000 W. Since most lithography is done by the offset process, the imaging element is exposed in such a way that the image obtained thereon is right reading. The exposure may be an exposure using optics or a contact exposure.

The diazo resin or diazonium salts are converted upon exposure from water soluble to water insoluble (due to the destruction of the diazonium groups) and additionally the photolysis products of the diazo may induce an advancement in the level of crosslinking of the polymeric binder or diazo resin, thereby selectively converting the surface, in an image pattern, from water soluble to water insoluble. The unexposed areas remain unchanged, i.e. water soluble.

Due to the intermediate hydrophilic layer used in connection of the present invention the remaining diazo is easily removed from the surface in the non-exposed or insufficiently exposed parts of the imaging element by washing or rinsing it with plain water.

The following examples illustrate the present invention without being limited thereto. The percentages given are by weight unless otherwise stated.

EXAMPLE 1

(Comparison)

Preparation of the Lithographic Base

To 440 g of a dispersion containing 21.5 % $TiO_2$ (average particle size 0.3 to 0.5 um) and 2.5% polyvinyl alcohol in deionized water were subsequently added, while stirring, 250 g of a 5% polyvinyl alcohol solution in water, 105 g of a hydrolyzed 22% tetramethyl orthosilicate emulsion in water and 22 g of a 10% solution of a wetting agent. To this mixture was then added 183 g of deionized water and the pH was adjusted to pH=4.

The thus obtained dispersion was coated on a polyethyleneterephthalate film support (coated with a hydrophilic adhesion layer) to a wet coating thickness of 50 $g/m^2$, dried at 30° C. and subsequently hardened by subjecting it to a temperature of 60° C. for 1 week.

Preparation of the Imaging Element

The following light sensitive composition was prepared:

To 63 g of a 20% dispersion of polymethylmethacrylate (particle diameter of 60 nm) stabilized with cetyltrimethylammonium bromide in deionized water was subsequently added, while stirring, 120 g of a 5% solution of a 88% hydrolized polyvinylacetate in water and 15 g of a 10% dispersion of heliogen blue (BASF) in water. 66 g of a 15% solution of the condensation product of difenyl amine diazonium salt and formaldehyde in water was then slowly added. Finally 10 g of a wetting agent and 726 ml of water were added.

The light sensitive composition was applied to a wet coating thickness of 35 g/m² to the lithographic base and dried at 30° C.

Preparation of the Lithographic Printing Plate

The above prepared imaging element was exposed through a mask to a high pressure halogen mercury vapour lamp of 1000 W at a distance of 70 cm for 5 minutes.

Subsequently the imaging element was developed with plain water. The obtained printing plate was used to print on a Heidelberg GTO printing machine using a conventional fountain solution and a greasy ink. The density obtained in the non-image areas on the 400th print was 0.06.

EXAMPLE 2

(Comparison)

Preparation of the Lithographic Base

To 440 g of a dispersion containing 21.5% TiO₂ (average particle size 0.3 to 0.5 um) and 2.5% polyvinyl alcohol in deionized water were subsequently added, while stirring, 250 g of a 5% polyvinyl alcohol solution in water, 105 g of a hydrolyzed 22% tetramethyl orthosilicate emulsion in water and 22 g of a 10% solution of a wetting agent. To this mixture was then added 6 g of a 10% solution of Dormacid (a dextran modified with group 8 of table 1 above and available from Pfeifer & Langen) and 177 g of deionized water and the pH was adjusted to pH=4.

The thus obtained dispersion was coated on a polyethyleneterephthalate film support (coated with a hydrophilic adhesion layer) to a wet coating thickness of 50 g/m² dried at 30° C. and subsequently hardened by subjecting it to a temperature of 60° C. for 1 week.

An imaging element was prepared similar as in example 1 with the exception that the above described lithographic base was used. The obtained imaging element was then image-wise exposed and processed as in example 1. The obtained printing plate was then used to print as in example 1 and it was found that the density in the non-image areas on the 400th print was 0.02.

EXAMPLE 3

(Comparison)

A lithographic base was prepared as described in example 1 and to this base was then provided an aqueous solution of polyvinylpyrrolidone and a wetting agent to a dry coating thickness of 30 mg of polyvinylpyrrolidone per square meter. The obtained element was then heated for 7 days at 60° C. and the light sensitive coating described in example 1 was then applied thereto as described in example 1 so that an imaging element was obtained.

The obtained imaging element was then used to prepare a lithographic printing plate as described in example 1. The printing plate was subsequently used to print as described in example 1 and a density in the non-image areas of the 400th copy was 0.01.

EXAMPLE 4

(Comparison)

An imaging element was prepared as described in example 3 with the exception that instead of polyvinylpyrrolidone an unmodified dextran was used.

The obtained imaging element was image-wise exposed and processed as described in example 1 and the resulting printing plate was used to print as described in example 1. The density in the non-image areas of the 400th copy was 0.02.

EXAMPLE 5

An imaging element was prepared as in example 3 with the exception that instead of the polyvinylpyrrolidone solution an aqueous solution (pH=5) of ethanolamine was used.

The obtained imaging element was image-wise exposed and processed as described in example 1 and the resulting printing plate was used to print as described in example 1. The density in the non-image areas of the 400th copy was 0.00.

EXAMPLE 6

An imaging element was prepared as in example 3 with the exception that instead of the polyvinylpyrrolidone solution an aqueous solution (pH=5) of Dormacid (a dextran modified with group 8 of table 1 above and available from Pfeifer & Langen) was used.

The obtained imaging element was image-wise exposed and processed as described in example 1 and the resulting printing plate was used to print as described in example 1. The density in the non-image areas of the 400th copy was 0.00.

We claim:

1. An imaging element comprising on a support in the order given, a hydrophilic layer containing a hydrophilic (co)polymer or (co)polymer mixture and being hardened with a hydrolyzed tetraalkyl orthosilicate crosslinking agent and a light-sensitive layer containing a diazo resin or a diazonium salt, an intermediate hydrophilic layer containing an organic compound having one or more cationic groups between said hydrophilic layer and said light-sensitive layer, said organic compound being a hydrophilic polysaccharide having one or more ammonium groups or a hydrophilic polysaccharide and a low molecular weight organic compound having one or more ammonium groups.

2. An imaging element according to claim 1 wherein said polysacharide is dextran or pullulan.

3. An imaging element according to claim 1 wherein said organic compound is comprised in said imaging element in an amount between 5 and 500 mg/m².

* * * * *